(12) United States Patent
Bedell et al.

(10) Patent No.: US 6,855,436 B2
(45) Date of Patent: Feb. 15, 2005

(54) FORMATION OF SILICON-GERMANIUM-ON-INSULATOR (SGOI) BY AN INTEGRAL HIGH TEMPERATURE SIMOX-GE INTERDIFFUSION ANNEAL

(75) Inventors: Stephen W. Bedell, Wappingers Falls, NY (US); Keith E. Fogel, Mohegan Lake, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/448,947

(22) Filed: May 30, 2003

(65) Prior Publication Data

US 2004/0241459 A1 Dec. 2, 2004

(51) Int. Cl.[7] .................................................. B32B 9/04
(52) U.S. Cl. ........................ 428/641; 428/642; 428/446; 428/448; 428/704
(58) Field of Search ................................. 428/641, 446, 428/448, 436, 642, 704

(56) References Cited

U.S. PATENT DOCUMENTS

| | | | | |
|---|---|---|---|---|
| 4,866,498 A | * | 9/1989 | Myers | 257/297 |
| 5,461,243 A | * | 10/1995 | Ek et al. | 257/190 |
| 5,563,428 A | * | 10/1996 | Ek et al. | 257/77 |
| 5,667,586 A | * | 9/1997 | Ek et al. | 117/84 |
| 5,759,898 A | * | 6/1998 | Ek et al. | 438/291 |
| 5,846,867 A | * | 12/1998 | Gomi et al. | 438/318 |
| 6,118,151 A | * | 9/2000 | Tsutsu | 257/347 |
| 6,190,975 B1 | * | 2/2001 | Kubo et al. | 438/285 |
| 6,515,335 B1 | * | 2/2003 | Christiansen et al. | 257/347 |
| 6,593,625 B2 | * | 7/2003 | Christiansen et al. | 257/347 |
| 6,607,948 B1 | * | 8/2003 | Sugiyama et al. | 438/151 |
| 2002/0030227 A1 | * | 3/2002 | Bulsara et al. | 257/346 |
| 2002/0185686 A1 | * | 12/2002 | Christiansen et al. | 257/347 |
| 2003/0139000 A1 | * | 7/2003 | Bedell et al. | 438/186 |
| 2004/0012075 A1 | * | 1/2004 | Bedell et al. | 257/616 |

* cited by examiner

*Primary Examiner*—Stephen Stein
(74) *Attorney, Agent, or Firm*—Scully, Scott, Murphy & Presser; Robert M. Trepp, Esq.

(57) ABSTRACT

A method of forming a substantially relaxed, high-quality SiGe-on-insulator substrate material using SIMOX and Ge interdiffusion is provided. The method includes first implanting ions into a Si-containing substrate to form an implant rich region in the Si-containing substrate. The implant rich region has a sufficient ion concentration such that during a subsequent anneal at high temperatures a barrier layer that is resistant to Ge diffusion is formed. Next, a Ge-containing layer is formed on a surface of the Si-containing substrate, and thereafter a heating step is performed at a temperature which permits formation of the barrier layer and interdiffusion of Ge thereby forming a substantially relaxed, single crystal SiGe layer atop the barrier layer.

11 Claims, 5 Drawing Sheets

FORMATION OF SILICON-GERMANIUM-ON-INSULATOR (SGOI) BY AN INTEGRAL HIGH TEMPERATURE SIMOX-GE INTERDIFFUSION ANNEAL

RELATED APPLICATION

This application is related to co-pending and co-assigned U.S. patent application Ser. No. 10/055,138, filed Jan. 23, 2002, entitled "Method of Creating High-Quality Relaxed SiGe-On-Insulator for Strained Si CMOS Applications", the entire content of which is incorporated herein by reference.

FIELD OF THE INVENTION

The present invention relates to a method of fabricating a semiconductor substrate material, and more particularly to a method of fabricating a substantially relaxed, high-quality SiGe alloy crystal layer over an insulating layer by combining aspects of silicon-on-insulator (SOI) formation with the interdiffusion of a Ge-containing layer. The method of the present invention provides substantially relaxed, high-quality SiGe-on-insulator substrate materials that can be used as a lattice mismatched template for creating a strained Si layer thereon by subsequent Si epitaxial overgrowth. Such strained Si layers have high carrier mobility and are useful in high-performance complementary metal oxide semiconductor (CMOS) applications. The present invention is also directed to SiGe-on-insulator substrate materials as well as structures that include at least the SiGe-on-insulator substrate material.

BACKGROUND OF THE INVENTION

In the semiconductor industry, silicon-on-insulator substrates may be formed using a process referred to in the art as separation by ion implantation of oxygen (SIMOX). In a conventional SIMOX process, a Si wafer is implanted with oxygen at high doses (on the order of 5E16 atoms/cm$^{-2}$ or greater) and then annealed and oxidized at very high temperatures (on the order of about 1300° C. or greater) to form a well-defined and continuous buried oxide layer below the surface of the Si wafer. The high-temperature annealing serves both to chemically form the buried oxide layer as well as to annihilate any defects that persist in the near-surface silicon layer by annealing near the melting point of silicon.

Because of the recent high-level activity using strained Si-based heterostructures, there is a need for providing SiGe-on-insulator (SGOI) substrates in which the SiGe layer is substantially relaxed and of high-quality. SGOI substrates may be formed using various processes including, for example, the SIMOX process. In the prior art, a thick SiGe layer having a thickness of about 1 to about 5 micrometers is first deposited atop a Si wafer and then the SIMOX process is performed. Such a prior art process suffers the following two drawbacks: 1) the Ge tends to diffuse into the bulk before a continuous oxide layer is formed and 2) the presence of Ge near the 0 peak inhibits the formation of a high-quality buried oxide layer unless the Ge concentration is very low.

In view of the drawbacks with prior art SIMOX processes of forming a SGOI substrate material, there is a need for providing a new and improved SIMOX method that reduces the tendency of Ge to diffuse into bulk Si before a continuous buried insulating layer is formed and provides a relaxed, high-quality SiGe alloy layer atop a buried insulating layer.

SUMMARY OF THE INVENTION

One object of the present invention is to provide a method of fabricating thin, high-quality, substantially relaxed SiGe-on-insulator substrate materials.

Another object of the present invention is to provide a method of fabricating thin, high-quality, substantially relaxed SiGe-on-insulator substrate materials that are stable against further defect production such as misfit and threading dislocations.

A further object of the present invention is to provide a method of fabricating thin, high-quality, substantially relaxed SiGe-on-insulator substrate materials that is compatible with CMOS processing steps.

A yet further object of the present invention is to provide a method of fabricating thin, high-quality, substantially relaxed SiGe-on-insulator substrate materials which can then be used as lattice mismatched templates, i.e., substrates, for forming strained Si layers.

A still further object of the present invention is to provide strained Si/substantially relaxed SiGe-on-insulator structures that have high carrier mobility and are useful in high-performance CMOS applications.

An even further object of the present invention is to provide a method of fabricating a substantially relaxed, high-quality SiGe alloy crystal layer over an insulating layer by combining aspects of silicon-on-insulator (SOI) formation with the interdiffusion of a Ge-containing layer.

Another object of the present invention is to provide a method of fabricating a substantially relaxed, high-quality SiGe-on-insulator substrate material that takes advantage of the defect annihilation properties of a SIMOX anneal, while allowing the formation of a substantially relaxed, high-quality SiGe alloy crystal layer over a buried insulating layer that is highly resistant to Ge diffusion.

These and other objects and advantages are achieved in the present invention by utilizing a method that includes first implanting ions, such as oxygen ions, into a Si-containing substrate to form an implant rich region in the Si-containing substrate. The implant rich region has a sufficient ion concentration such that during a subsequent anneal at high temperatures a barrier layer that is resistant to Ge diffusion is formed. Next, a Ge-containing layer, such as SiGe or pure Ge, is formed on a surface of the Si-containing substrate, and thereafter a heating step is performed at a temperature which permits formation of the barrier layer and interdiffision of Ge thereby forming a substantially relaxed, single crystal SiGe layer atop the barrier layer. It is noted that the substantially relaxed, single crystal layer is comprised of a homogeneous mixture of at least the SiGe or pure Ge layer as well as part of the Si-containing substrate that lays above the implant rich region.

Following these steps of the present invention, a strained Si layer may be grown epitaxially atop the substantially relaxed single crystal SiGe layer to form a strained Si/relaxed SiGe-containing heterostructure that can be used in a variety of high-performance CMOS applications.

The present method also contemplates forming barrier layers that are unpatterned (i.e., barrier layers that are continuous) or patterned (i.e., discrete and isolated barrier regions or islands which are surrounded by semiconductor material).

In yet another embodiment of the present invention, a Si cap layer is formed atop the Ge-containing layer prior to heating the structure. This embodiment of the present invention alters the thermodynamic stability (in terms of preventing defect production) of the SiGe layer before annealing. The SiGe layer has a thickness of about 2000 nm or less, with a thickness of from about 10 to about 200 nm being more highly preferred.

Another aspect of the present invention relates to the SiGe-on-insulator substrate material that is formed utilizing the above-mentioned processing steps. Specifically, the inventive substrate material comprises a Si-containing substrate; an insulating region that is resistant to Ge diffusion present atop the Si-containing substrate; and a substantially relaxed SiGe layer present atop the insulating region, wherein the substantially relaxed SiGe layer has a thickness of about 2000 nm or less. A characteristic feature of the inventive SiGe-on-insulator substrate material is that it has a defect density that is typical of contemporary SGOI material. Specifically, the SiGe-on-insulator substrate material of the present invention has a measured defect density of about $5\times10^7$ $cm^{-2}$ or less.

A yet further aspect of the present invention relates to a heterostructure which includes at least the above-mentioned substrate material. Specifically, the heterostructure of the present invention comprises a Si-containing substrate; an insulating region that is resistant to Ge diffusion present atop the Si-containing substrate; a substantially relaxed SiGe layer present atop the insulating region, wherein the substantially relaxed SiGe layer has a thickness of about 2000 nm or less; and a strained Si layer formed atop the substantially relaxed SiGe layer.

Other aspects of the present invention relate to superlattice structures as well as templates for other lattice mismatched structures which include at least the SiGe-on-insulator substrate material of the present invention.

DETAILED DESCRIPTION OF THE INVENTION

Figure 1A:
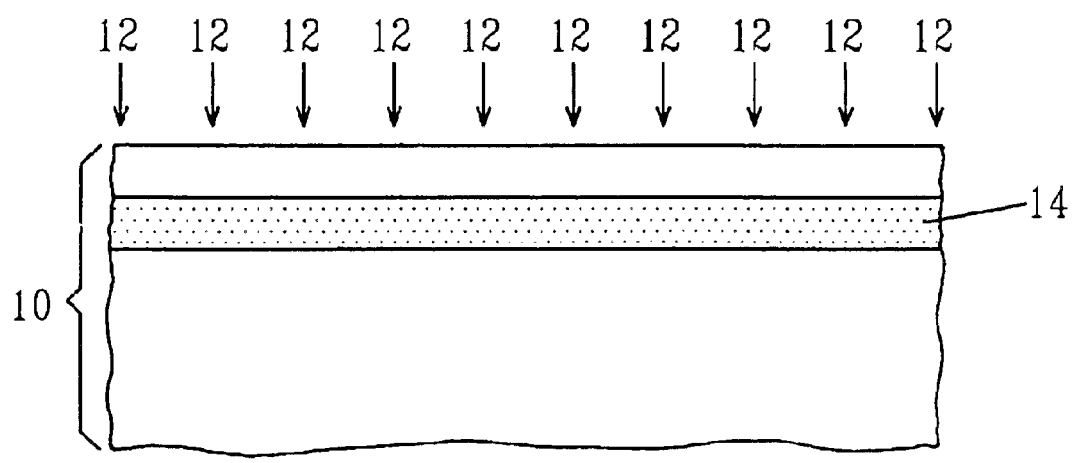
FIGS. 1A–1D are pictorial representations (through cross-sectional views) showing the basic processing steps that are employed in the present invention in fabricating a thin, high-quality, substantially relaxed SiGe-on-insulator substrate material. In these drawings, a continuous, i.e., unpatterned, barrier layer that is resistant to Ge diffusion is formed.

The present invention, which provides a method of fabricating thin, high-quality, substantially relaxed SiGe-on-insulator substrate materials which can then serve as a lattice mismatched template for subsequent overgrowth of epitaxial Si, will now be described in greater detail by referring to the drawings the accompany the present application. In the accompanying drawings, like and/or corresponding elements are referred to by like reference numerals.

Reference is first made to FIGS. 1A–1D which illustrate the basic processing steps of the present invention. Specifically, FIG. 1A shows the first processing step of the present invention in which ions 12 are implanted into a Si-containing substrate 10 so as to form an implant rich region 14 in the Si-containing substrate 10. As illustrated, the implant rich region 14 is located beneath a surface layer of Si-containing substrate 10. The term "Si-containing" as used herein denotes a semiconductor substrate that includes at least silicon. Illustrative examples include, but are not limited to: Si, SiGe, SiC, SiGeC, Si/Si, Si/SiC, Si/SiGeC, and preformed silicon-on-insulators which may include any number of buried oxide (continuous, non-continuous or mixtures of continuous and non-continuous) regions present therein.

The ions 12 that are implanted into the Si-containing substrate 10 at this point of the present invention are any ions that are capable of forming a barrier layer that is resistant to Ge diffusion when subjected to a subsequent heating step. Illustrative examples of such ions include, but are not limited to: oxygen ions, nitrogen ions, NO ions, inert gases and mixtures thereof. Preferred ions 12 that are implanted into the Si-containing substrate 10 at this point of the present invention are oxygen ions.

The ions 12 are implanted into the Si-containing substrate 10 in a sufficient concentration that forms an implant rich region 14 in the Si-containing substrate. The implant rich region 14 formed at this point of the present invention has an ion concentration that is sufficient to form a barrier layer resistant to Ge diffusion in the Si-containing substrate when subjected to a subsequent heating step. Typically, the implant rich region 14 formed in this step of the present invention has an ion concentration of about $1\times10^{22}$ atoms/$cm^3$ or greater.

The implant rich region 14 is formed below the upper surface of Si-containing substrate 10 such that a surface layer of Si-containing material lies atop the implant rich region 14. Typically, the implant rich region 14 is formed about 5 nin or greater below the upper surface of the Si-containing substrate 10.

Figure 2A:
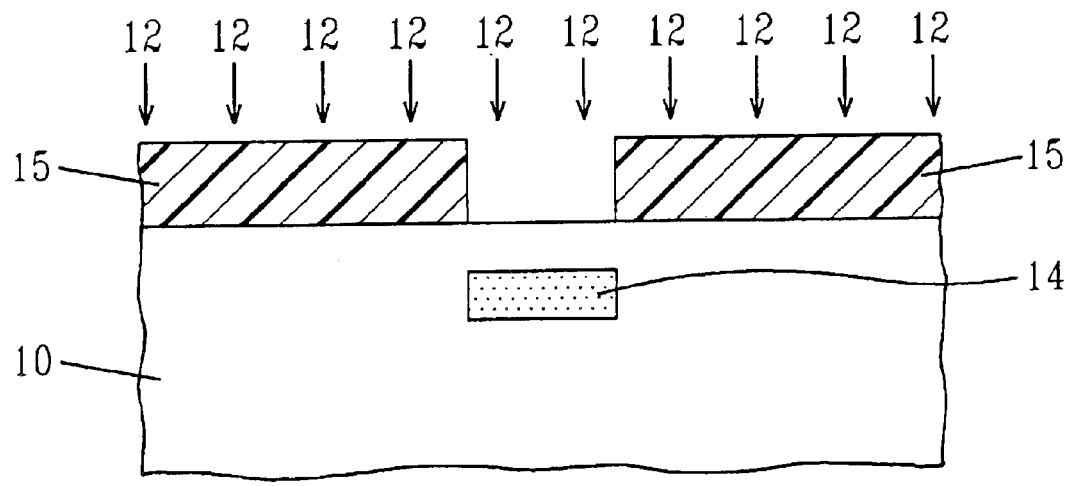
FIGS. 2A–2D are pictorial representations (through cross-sectional views) showing the basic processing steps that are employed in an alternative embodiment of the present invention in fabricating a thin, high-quality, substantially relaxed SiGe-on-insulator substrate material. In these drawings, a patterned barrier layer that is resistant to Ge diffusion is formed.
Figure 2B:
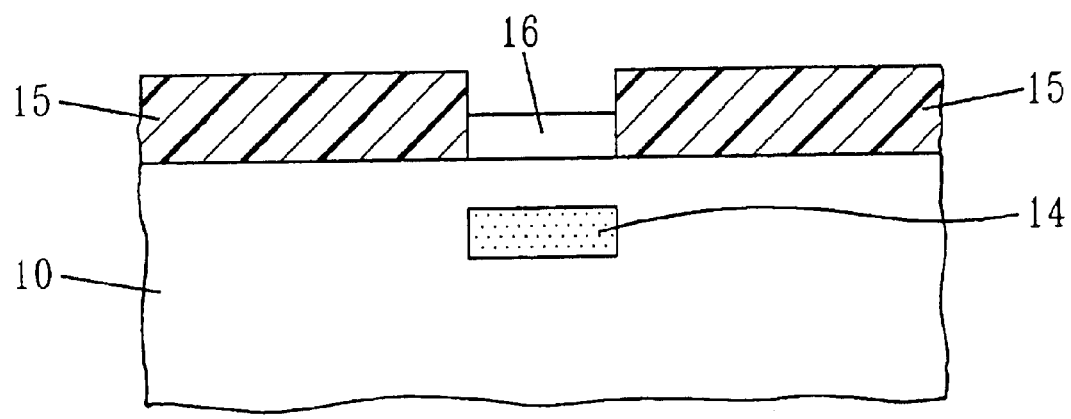

The ions 12 are implanted using conventional SIMOX processes and conditions that are well known to those skilled in the art, as well as the various SIMOX processes and conditions mentioned in co-assigned U.S. patent applications Ser. No. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are being incorporated herein by reference. The implant may be a blanket implant as shown in FIG. 1A or a patterned implant as shown in FIG. 2A may be employed. The patterned implant may include a mask formed directly on the upper surface of the Si-containing substrate 10 or a mask that is located some distance from the upper surface of the Si-containing substrate 10 may be employed.

Although various implant conditions can be employed in the present invention, the following provides general implant conditions for forming an implant rich region 14 in the Si-containing substrate 10:

I. High-dose ion implantation: The term "high-dose" as used herein denotes an ion dosage of about 4E17 $cm^{-2}$ or greater, with an ion dosage of from about 4E17 to about 2E18 $cm^{-2}$ being more preferred. In addition to using high-ion dosage, this implant is typically carried out in an ion implantation apparatus that operates at a beam current density of from about 0.05 to about 500 milliamps cm$^{-2}$ and at an energy of from about 150 to about 1000 keV. More preferably, this implant is carried out using an energy of from about 150 to about 210 keV.

This implant, which may be referred to as a base ion implant, is carried out at a temperature of from about 200° C. to about 800° C. at a beam current density of from about 0.05 to about 500 mA cm$^{-2}$. More preferably, the base ion implant may be carried out at a temperature of from about 200° C. to about 600° C. at a beam current density of from about 5 to about 10 mA cm$^{-2}$.

If desired, the base ion implant step may be followed by a second oxygen implant that is carried out using an ion dose of from about 1E14 to about 1E16 cm$^{-2}$, with an ion dose of from about 1E15 to about 4E15 cm$^{-2}$ being more highly preferred. The second ion implant is carried out at an energy of from about 40 keV or greater, with an energy of from about 120 to about 450 keV being more preferred.

This second implant is performed at a temperature of from about 4K to about 200° C. with a beam current density of from about 0.05 to about 10 mA cm$^{-2}$. More preferably, the second ion implant may be performed at a temperature of from about 25° C. to about 100° C. with a beam current density of from about 0.5 to about 5.0 mA cm$^{-2}$.

Note that the second ion implant forms an amorphous region below the damaged region caused by the base ion implant step. During the subsequent heating step of the present invention, the amorphous and damaged region become part of a barrier layer that is resistant to Ge diffusion.

II. Low-dose ion implant: The term "low-dose" as used herein for this embodiment of the present invention denotes an ion dose of about 4E17 cm$^{-2}$ or less, with an ion dose of from about 1E16 to about 3.9E17 cm$^{-2}$ being more preferred. This low-dose implant is performed at an energy of from about 40 to about 10000 keV, with an implant energy of from about 40 to about 210 keV being more highly preferred.

This implant, which may be referred to as a base ion implant, is carried out at a temperature of from about 100° C. to about 800° C. More preferably, the base ion implant may be carried out at a temperature of from about 200° C. to about 650° C. with a beam current density of from about 0.05 to about 500 mA cm$^{-2}$.

If desired, the base implant step may be followed by a second ion implant that is carried out using the conditions mentioned above.

It is again emphasized that the above types of implant conditions are exemplary and by no way limit the scope of the present invention. Instead, the present invention contemplates all conventional ion implants that are typically employed in conventional SIMOX processes.

Figure 1B:
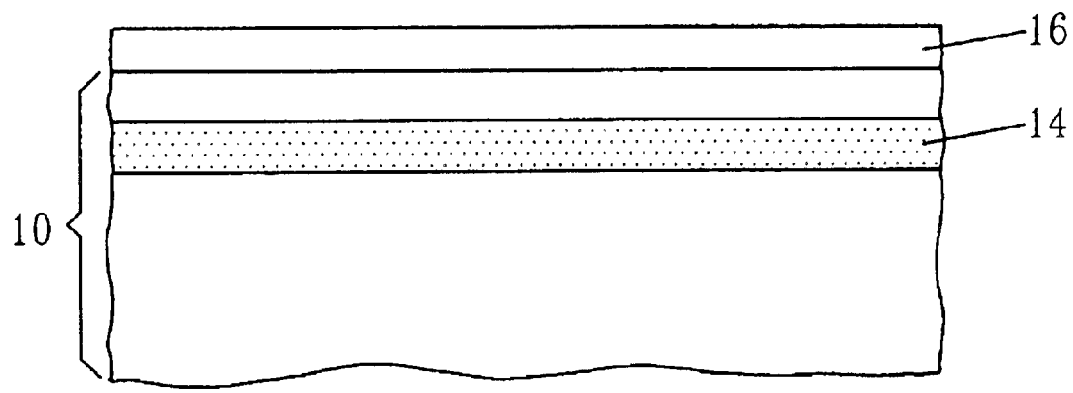

FIG. 1B illustrates the structure that is formed after a Ge-containing layer 16 is formed atop the upper surface of Si-containing substrate 10. The Ge-containing layer 16 formed at this point of the present invention may be a SiGe alloy layer or a pure Ge layer. The term "SiGe alloy layer" includes SiGe alloys that comprise up to 99.99 atomic percent Ge, whereas pure Ge includes layers that comprise 100 atomic percent Ge. When SiGe alloy layers are employed, it is preferred that the Ge content in the SiGe alloy layer be from about 0.1 to about 99.9 atomic percent, with a Ge atomic percent of from about 10 to about 35 being even more highly preferred.

In accordance with the present invention, the Ge-containing layer 16 is formed atop an upper surface of the Si-containing substrate 10 using any conventional epitaxial growth method that is well known to those skilled in the art which is capable of (i) growing a thermodynamically stable (below a critical thickness) SiGe alloy or pure Ge layer, (ii) growing a SiGe alloy or pure Ge layer that is metastable and free from defects, i.e., misfit and TD dislocations, or (iii) growing a partially or fully relaxed SiGe layer, the extent of relaxation being controlled by growth temperature, Ge concentration, thickness, or the presence of a Si capping layer. Illustrative examples of such epitaxial growing processes that are capable of satisfy conditions (i), (ii) or (iii) include, but are not limited to: low-pressure chemical vapor deposition (LPCVD), ultra-high vacuum chemical vapor deposition (UHVCVD), atmospheric pressure chemical vapor deposition (APCVD), molecular beam (MBE) epitaxy and plasma-enhanced chemical vapor deposition (PECVD).

The thickness of the Ge containing layer 16 formed at this point of the present invention may vary, but typically the Ge-containing layer 16 has a thickness of from about 10 to about 500 nm, with a thickness of from about 20 to about 200 nm being more highly preferred.

Figure 3A:
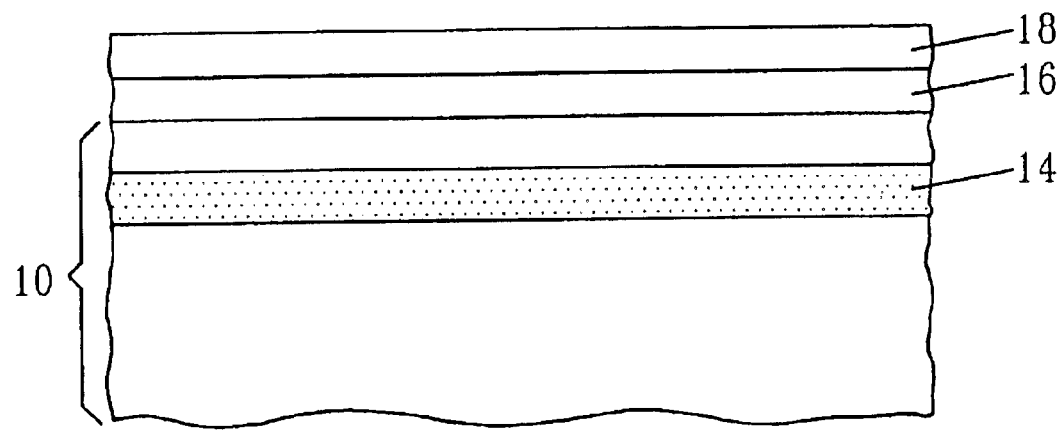
FIGS. 3A–3B are pictorial representations (through cross-sectional views) showing an alternative embodiment of the present invention wherein a Si cap layer is formed atop a Ge-containing layer which is formed on the structure shown in FIG. 1B or the structure shown in FIG. 2B.
Figure 3B:
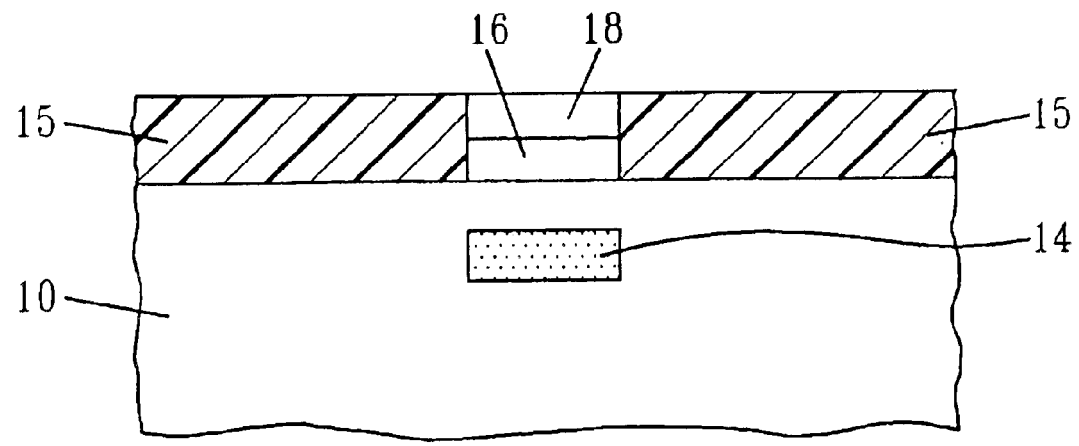

In an alternative embodiment of the present invention, see FIG. 3A-3B, optional cap layer 18 is formed atop Ge-containing layer 16 prior to performing the heating step of the present invention. The optional cap layer employed in the present invention comprises any Si or Si-containing material including, but not limited to: epitaxial silicon (epi-Si), epitaxial silicon-germanium (epi-SiGe), amorphous silicon (a:Si), amorphous silicon-germanium (a:SiGe), single or polycrystalline Si or any combination thereof including multilayers. In a preferred embodiment, the cap layer 18 is comprised of epi Si. It is noted that layers 16 and 18 may, or may not, be formed in the same reaction chamber.

When present, optional cap layer 18 has a thickness of from about 1 to about 100 nm, with a thickness of from about 1 to about 30 nm being more highly preferred. The optional cap layer 18 is formed utilizing any well-known deposition process including the epitaxial growth processes mentioned above.

In one embodiment of the present invention, it is preferred to form a pure Ge or SiGe alloy (15 to 20 atomic percent Ge) layer 16 having a thickness of from about 1 to about 2000 nm on the surface of the Si-containing substrate 10, and thereafter form a Si cap layer 18 having a thickness of from about 1 to about 100 nm atop the Ge or SiGe layer.

Figure 1C:
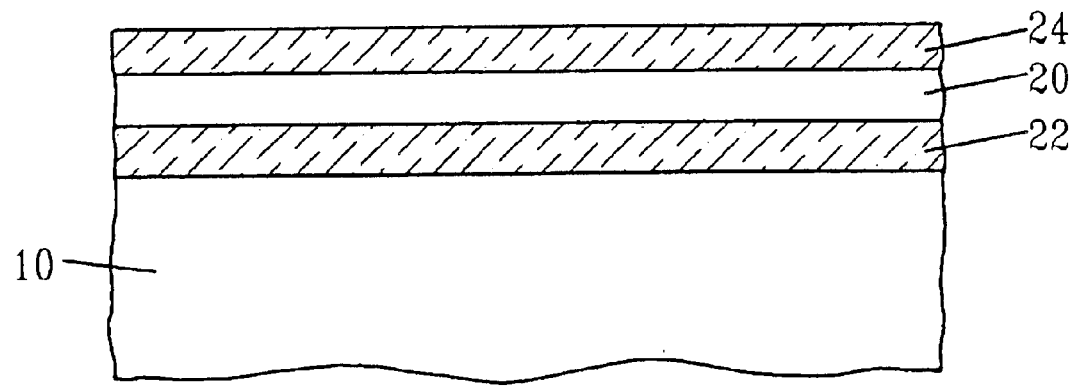

After forming the Ge-containing layer 16 (and optional cap layer 18) atop the implanted Si-containing substrate, the substrate is then heated, i.e., annealed, at a temperature which permits interdiffusion of Ge throughout the surface Si-containing layer, Ge-containing layer 16 and, if present, the optional Si cap 18 thereby forming substantially relaxed, single crystal SiGe layer 20 atop a barrier layer 22 that is also formed during the heating step. FIG. 1C shows the resultant structure that is formed after the heating step of the present invention has been performed. Note that oxide layer 24 is formed atop layer 20 during the heating step. This oxide layer is typically, but not always, removed from the structure after the heating step using a conventional wet etch process wherein a chemical etchant such as HF that has a high selectivity for removing oxide as compared to SiGe is employed.

Note that when the oxide layer is removed, a single crystal Si layer can be formed atop layer 20 and the above processing steps of the present invention may be repeated any number of times to produce a multilayered relaxed SiGe substrate material.

The oxide layer 24 formed after the heating step of the present invention has a variable thickness which may range from about 10 to about 1000 nm, with a thickness of from about 20 to about 500 nm being more highly preferred.

Specifically, the heating step of the present invention is an annealing step that is performed at a high temperature of from about 900° C. to about 1350° C., with a temperature of from about 1200° C. to about 1335° C. being more highly preferred. Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The heating step may be carried out for a variable period of time that typically ranges from about 10 to about 1800 minutes, with a time period of from about 60 to about 600 minutes being more highly preferred. The heating step may be carried out at a single targeted temperature, or various ramp and soak cycles using various ramp rates and soak times can be employed.

The heating step is performed under an oxidizing ambient to achieve the presence of a surface oxide layer, i.e., layer 24, which acts as a diffusion barrier to Ge atoms. Therefore, once the oxide layer 24 is formed on the surface of the structure, Ge becomes trapped between barrier layer 22 and oxide layer 24. As the surface oxide increases in thickness, the Ge becomes more uniformly distributed throughout layers 14, 16, and optionally 18, but it is continually and efficiently rejected from the encroaching oxide layer. So as the (now homogenized) layers are thinned during this heating step, the relative Ge fraction increases. Efficient thermal mixing is achieved in the present invention when the heating step is carried out at a temperature of from about 1200° C. to about 1320° C. in a diluted oxygen-containing gas.

It is also contemplated herein to use a tailored heat cycle that is based upon the melting point of the SiGe layer. In such an instance, the temperature is adjusted to tract below the melting point of the SiGe layer.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

The role of the high-temperature heating step of the present invention is (1) to form a barrier layer 22 that is resistant to Ge diffusion in the Si-containing substrate: (2) to allow Ge atoms to diffuse more quickly thereby maintaining a homogeneous distribution during annealing; and (3) to subject the initial layered structure to a thermal budget which will facilitate an equilibrium configuration. After this heating step has been performed, the structure includes a uniform and substantially relaxed SiGe alloy layer, i.e., layer 20, sandwiched between the barrier layer 22 and surface oxide layer 24.

In accordance with the present invention, the substantially relaxed SiGe layer 20 has a thickness of about 2000 nm or less, with a thickness of from about 10 to about 100 nm being more highly preferred. The barrier layer 22 formed during the annealing step of the present invention has a thickness of about 500 nm or less, with a thickness of from about 50 to about 200 nm being more highly preferred. Note that the substantially relaxed SiGe layer 20 formed in the present invention is thinner than prior art SiGe buffer layers and has a defect density including misfits and TDs, of less than about $5 \times 10^7$ defects/cm$^2$. This defect density value approaches those reported for contemporary SGOI materials.

The substantially relaxed SiGe layer 20 formed in the present invention has a final Ge content of from about 0.1 to about 99.9 atomic percent, with an atomic percent of Ge of from about 10 to about 35 being more highly preferred. Another characteristic feature of the substantially relaxed SiGe layer 20 is that it has a measured lattice relaxation of from about 1 to about 100%, with a measured lattice relaxation of from about 50 to about 80% being more highly preferred.

Figure 2C:
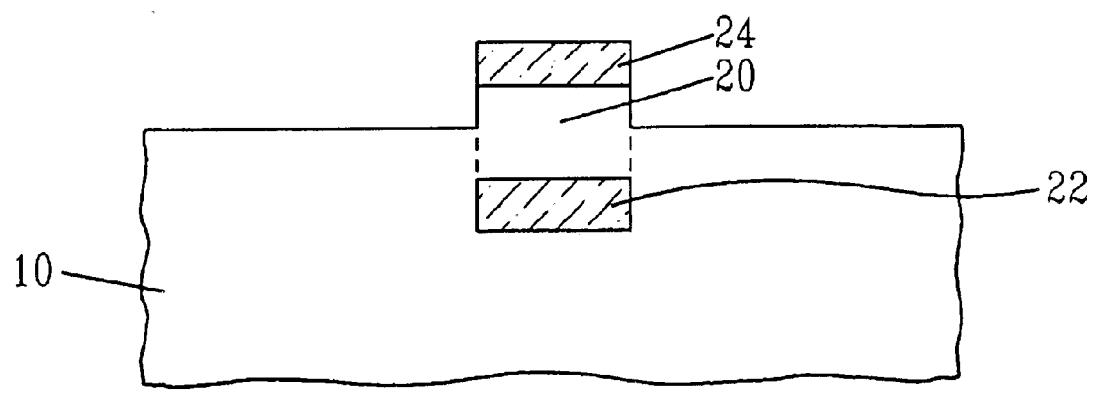
Figure 2D:
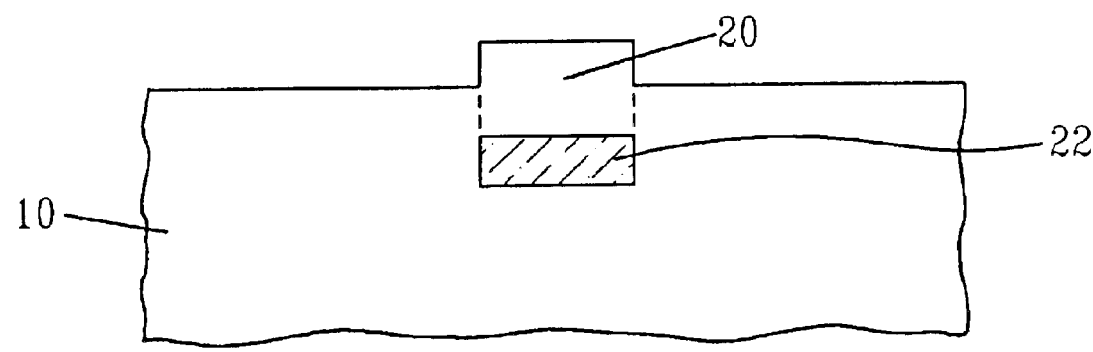

As stated above, the surface oxide layer 24 may be stripped at this point of the present invention so as to provide the SiGe-on-insulator substrate material shown, for example, in FIG. 2D (note that the substrate material does not include the cap layer since that layer has been used in forming the relaxed SiGe layer).

FIGS. 2A–2D show an embodiment of the present invention in which a patterned barrier layer 22 is formed. In this embodiment of the present invention, a masked ion implantation step such as shown in FIG. 2A is performed. In FIG. 2A, reference numeral 15 denotes an implantation mask that is used in this embodiment of the present invention. The implantation mask shown in FIG. 2A is formed using conventional techniques well know in the art. Although the implantation mask 15 may be removed after the implant step shown in FIG. 2A, it may also remain on the structure during the formation of Ge-containing layer 16, See FIG. 2B. After forming the Ge-containing layer 16, the mask 15 may be removed at this point of the present invention. Implantation mask removal is carried out using conventional stripping processes well known to those skilled in the art. FIG. 2C shows the structure after the heating step and FIG. 2D shows the structure after removing oxide layer 24. Note the implantation mask may remain on the structure throughout the entire process.

Figure 1D:
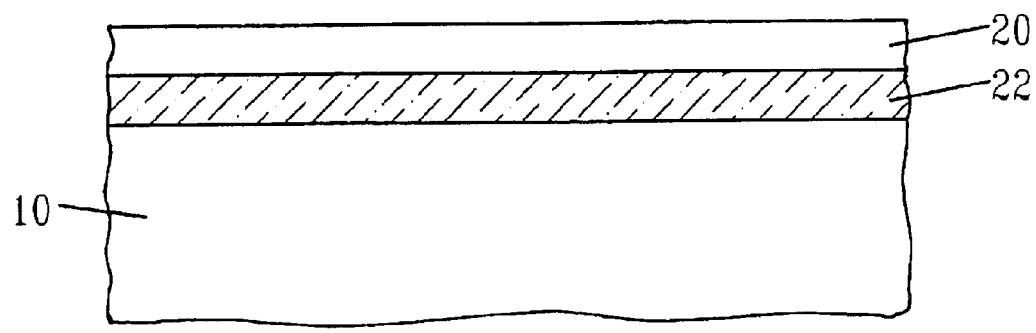
Figure 4A:
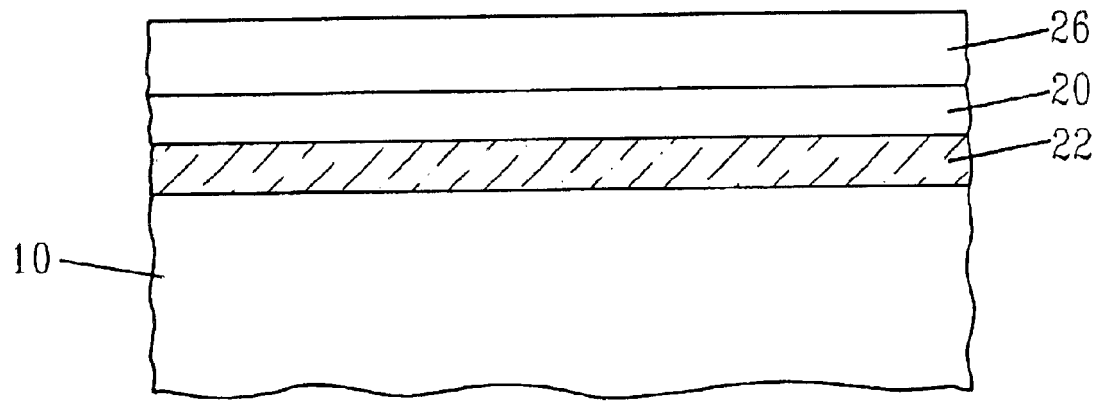
FIGS. 4A–4B are pictorial representations (through cross-sectional views) showing the formation of a strained Si layer on the thin, high-quality, substantially relaxed SiGe-on-insulator substrate material of FIGS. 1D and 2D, respectively.
Figure 4B:
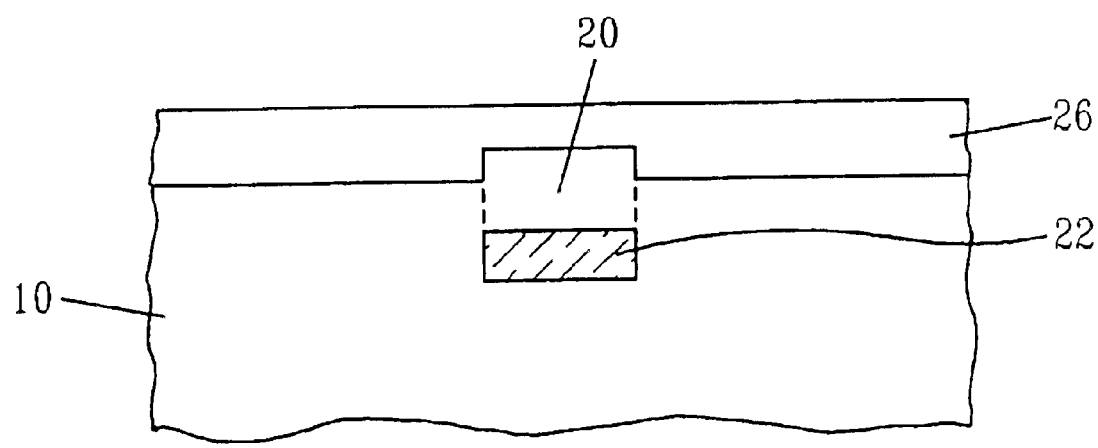

FIGS. 4A–B show the structure that is obtained after forming a Si layer 26 atop the SiGe layer 20 of FIGS. 1D and 2D, respectively. Si layer 26 is formed using a conventional epitaxial deposition process well known in the art. The thickness of the epi-Si layer 26 may vary, but typically, the epi-Si layer 26 has a thickness of from about 1 to about 100 nm, with a thickness of from about 1 to about 30 nm being more highly preferred.

In some instances, additional SiGe can be formed atop the substantially relaxed SiGe layer 20 utilizing the above mentioned processing steps, and thereafter epi-Si layer 26 may be formed. Because layer 20 has a large in-plane lattice parameter as compared to epi-layer 26, epi-layer 26 will be strained in a tensile manner.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers Si and SiGe formed atop the substantially relaxed SiGe layer of the substrate material.

In the case of lattice mismatched structures, GaAs, GaP or other like compound would be formed atop the substantially relaxed SiGe layer of the inventive SiGe-on-insulator substrate material.

Figure 5:
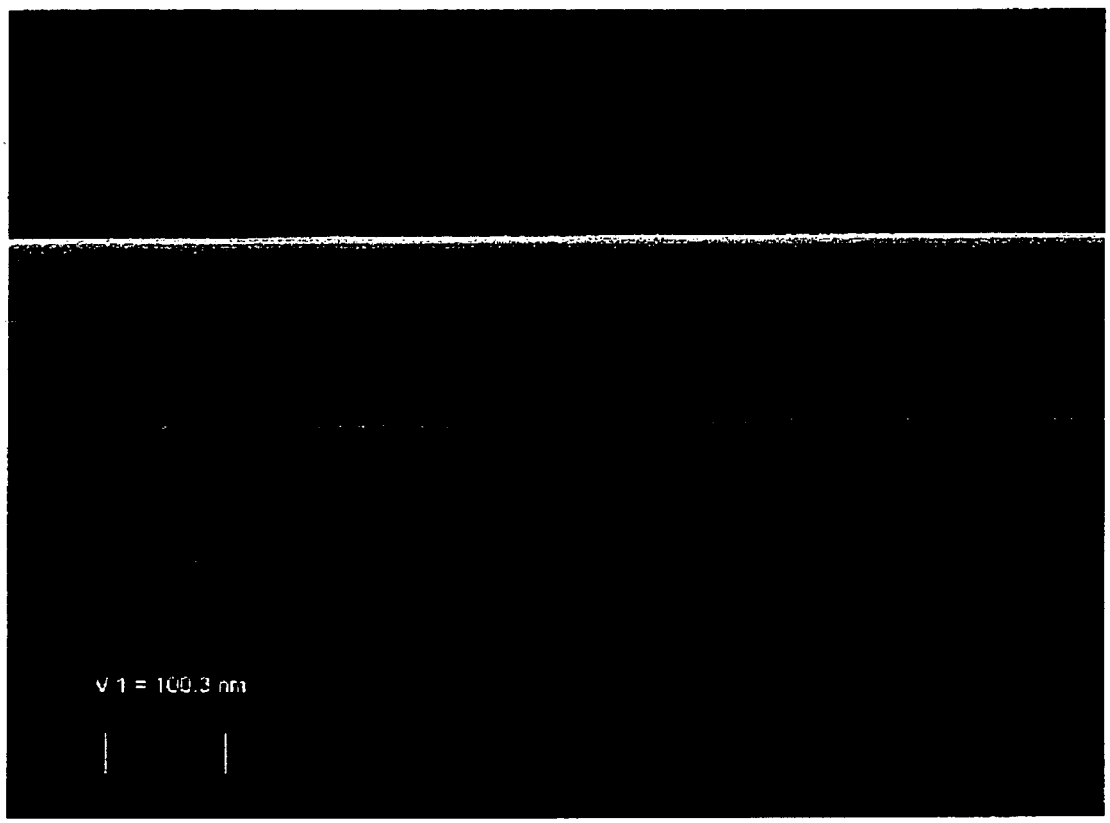
FIG. 5 is a SEM of a SiGe-on-insulator substrate material formed using the processing steps of the present invention.

FIG. 5 is an actual SEM of a substantially relaxed SiGe-on-insulator substrate material that was formed using the method of the present invention (with the surface oxide stripped off). In particular, the SiGe-on-insulator substrate material shown in FIG. 5 was prepared by first implanting oxygen ions into a Si-containing wafer using implant conditions that fall within the ranges mentioned above. A 600 Å-17% SiGe alloy layer was then grown atop the implanted Si-containing substrate and thereafter a single anneal/oxidation was carried out at 1320° C. in a Ar—$O_2$ atmosphere. In the image, the top (black) region is the area above the sample (SEM chamber). The first light-gray layer is the SGOI layer, below that is a darker gray band which is the buried oxide layer (BOX) formed during the high-temperature step. The light gray layer below the BOX is the Si substrate. X-ray diffraction showed that the SiGe layer (94.2 nm) contained 4 atomic % Ge and was 92% relaxed. The buried oxide had a thickness of about 47.10 nm and was continuous and well-formed.

In summary, the SiGe-on-insulator substrate material is formed in the present invention as an integrated process that combines the benefits of the high temperature SIMOX anneal with the simplicity of the Ge diffusion and segregation method of forming SiGe-on-insulators.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A substrate material comprising:

a Si-containing substrate;

an insulating region that is resistant to Ge diffusion present atop said Si-containing substrate; and a substantially relaxed SiGe layer present atop said insulating region, wherein said substantially relaxed SiGe layer has a thickness of about 2000 nm or less and a defect density of from about $5 \times 10^7$ atoms/$cm^{-2}$ or less.

2. The substrate material of claim 1 wherein said insulating region is patterned or unpatterned.

3. The substrate material of claim 2 wherein said insulating region is a buried oxide region.

4. The substrate material of claim 1 wherein said substantially relaxed SiGe layer has a measured lattice relaxation of from about 1 to about 100%.

5. A heterostructure comprising:

a Si-containing substrate;

an insulating region that is resistant to Ge diffusion present atop the Si-containing substrate;

a substantially relaxed SiGe layer present atop the insulating region, wherein the substantially relaxed SiGe layer has a thickness of about 2000 nm or less and a defect density of from about $5 \times 10^7$ atoms/$cm^{-2}$ or less; and a strained Si layer formed atop the substantially relaxed SiGe layer.

6. The heterostructure of claim 5 wherein said insulating region is patterned or unpatterned.

7. The heterostructure of claim 5 wherein said insulating region barrier layer is a buried oxide region.

8. The heterostructure of claim 5 wherein said substantially relaxed SiGe layer has a measured lattice relaxation of from about 1 to about 100%.

9. The heterostructure of claim 5 wherein said strained Si layer comprises an epi-Si layer.

10. The heterostructure of claim 5 wherein alternating layers of relaxed SiGe and strained Si are formed atop said strained Si layer.

11. The heterostructure of claim 5 wherein said strained Si layer is replaced with a lattice mismatched compound selected from the group consisting of GaAs and GaP.

* * * * *

UNITED STATES PATENT AND TRADEMARK OFFICE
CERTIFICATE OF CORRECTION

PATENT NO. : 6,855,436 B2
DATED : February 15, 2005
INVENTOR(S) : Stephen W. Bedell et al.

It is certified that error appears in the above-identified patent and that said Letters Patent is hereby corrected as shown below:

Column 5,
Line 8, "500 mA cm$^{-2}$" should read -- 500 mA cm$^{-2}$ --.

Column 6,
Line 8, "layer, the" should read -- layer; the --.
Line 18, "Ge containing" should read -- Ge - containing --.

Column 10,
Line 7, "of claim 2" should read -- of claim 1 --.

Signed and Sealed this

Sixth Day of December, 2005

JON W. DUDAS
*Director of the United States Patent and Trademark Office*